US011355373B2

(12) United States Patent
Onishi et al.

(10) Patent No.: US 11,355,373 B2
(45) Date of Patent: Jun. 7, 2022

(54) ASSEMBLY JIG SET AND MANUFACTURING METHOD OF SEMICONDUCTOR MODULE

(71) Applicant: FUJI ELECTRIC CO., LTD., Kanagawa (JP)

(72) Inventors: Kazunaga Onishi, Matsumoto (JP); Takeshi Yokoyama, Matsumoto (JP); Masaki Maruyama, Shinagawa-ku (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 89 days.

(21) Appl. No.: 16/799,689

(22) Filed: Feb. 24, 2020

(65) Prior Publication Data

US 2020/0335375 A1 Oct. 22, 2020

(30) Foreign Application Priority Data

Apr. 18, 2019 (JP) .............................. JP2019-079021

(51) Int. Cl.
*H01L 21/67* (2006.01)
*H01L 21/68* (2006.01)

(52) U.S. Cl.
CPC ................................... *H01L 21/68* (2013.01)

(58) Field of Classification Search
CPC ... H01L 21/50; H01L 21/52; H01L 21/67121; H01L 21/67144
See application file for complete search history.

(56) References Cited

U.S. PATENT DOCUMENTS

2012/0202322 A1 8/2012 Takahashi
2014/0117526 A1* 5/2014 Nishiuchi ........... H01L 21/4842
257/693

FOREIGN PATENT DOCUMENTS

| JP | 2006120918 A | 5/2006 |
| JP | 2007194477 A | 8/2007 |
| JP | 2009267161 A | 11/2009 |
| JP | 2010098153 A | 4/2010 |
| JP | 2012164841 A | 8/2012 |
| JP | 2012238638 A | 12/2012 |
| JP | 2013021145 A | 1/2013 |
| JP | 2015126212 A | 7/2015 |

* cited by examiner

*Primary Examiner* — Jae Lee

(57) ABSTRACT

Provided is an assembly jig set of semiconductor module having a plurality of semiconductor chips, the assembly jig set comprising: a first outer frame jig; and a plurality of inner piece jigs positioned by the first outer frame jig and each having a sectioned shape corresponding to the first outer frame jig, wherein one of the inner piece jigs has a plurality of opening portions for positioning the semiconductor chips. A manufacturing method of a semiconductor module using an assembly jig set is provided.

18 Claims, 14 Drawing Sheets

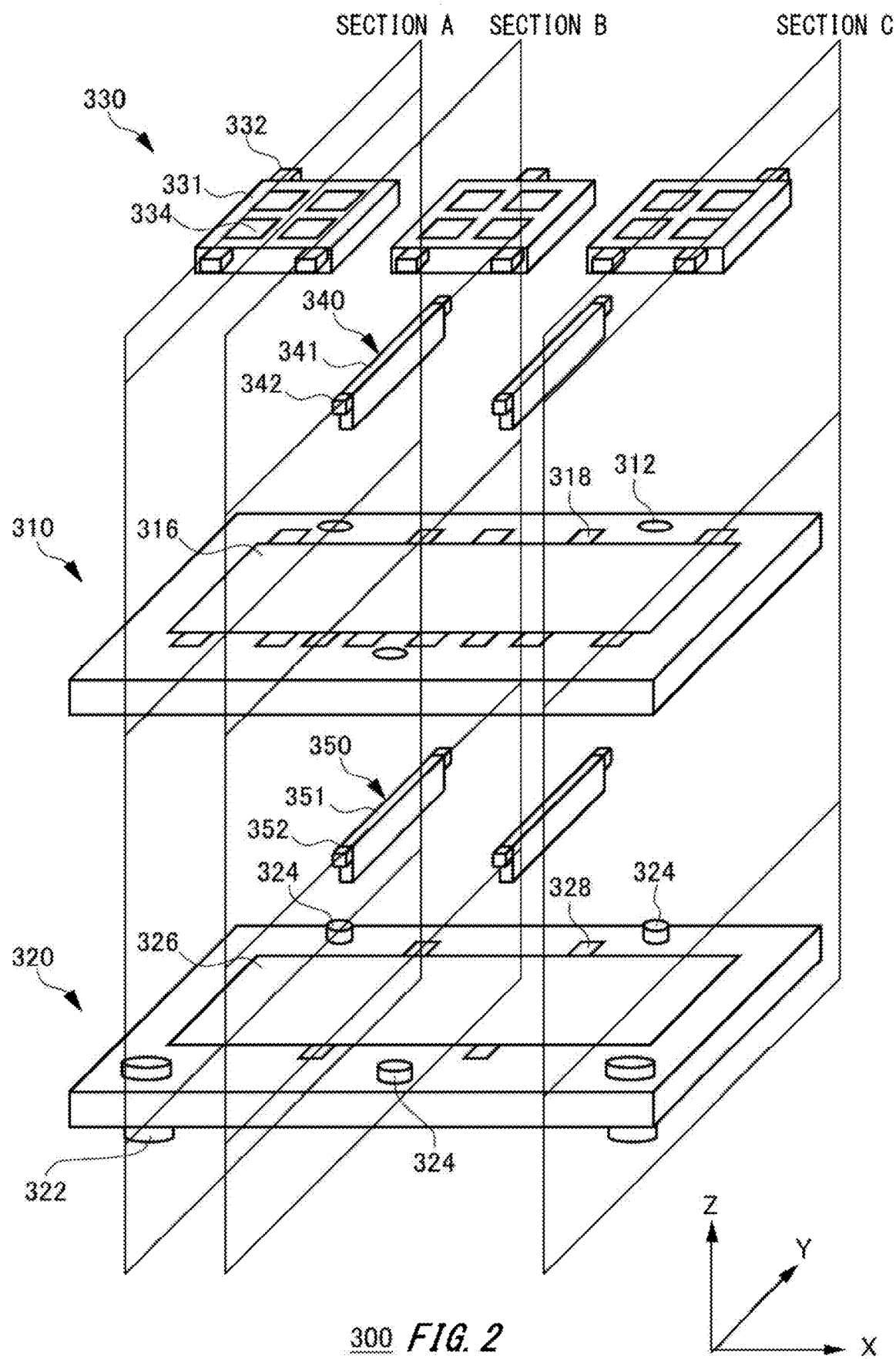
300 FIG. 2

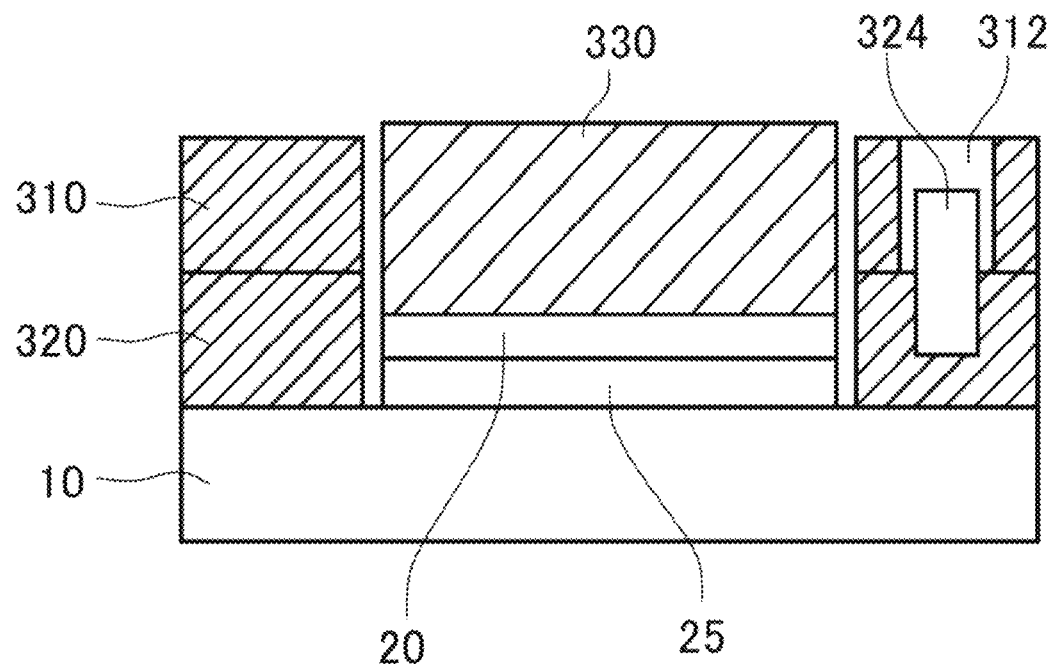
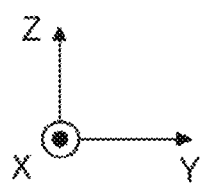
SECTION A
FIG. 3A

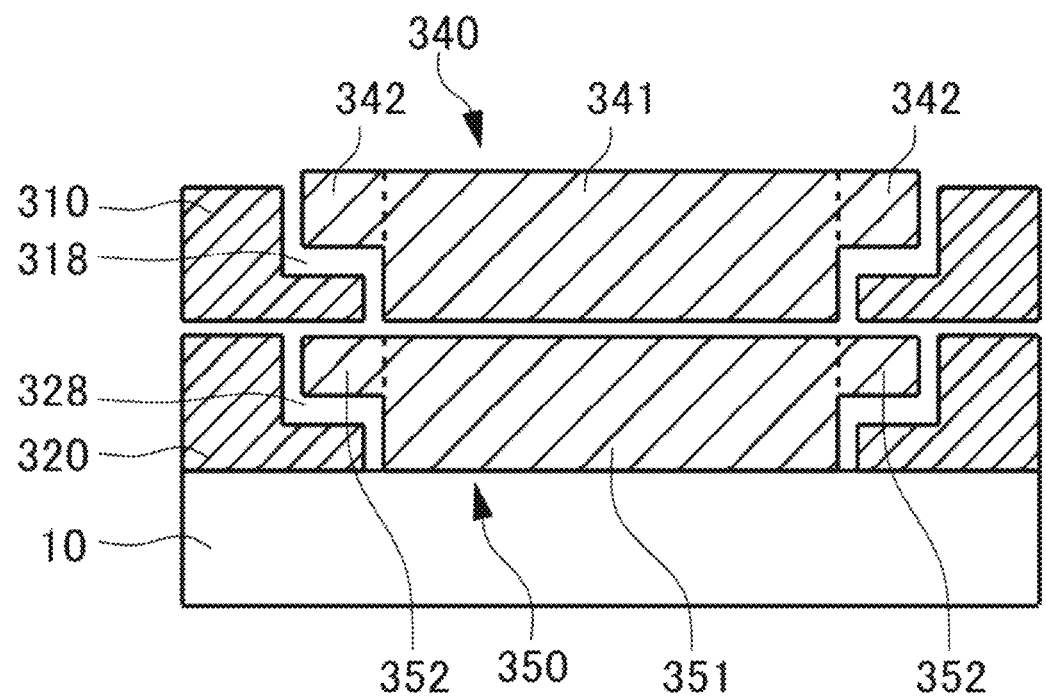
SECTION B
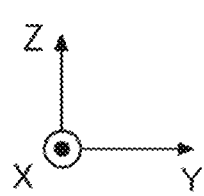
FIG. 3B

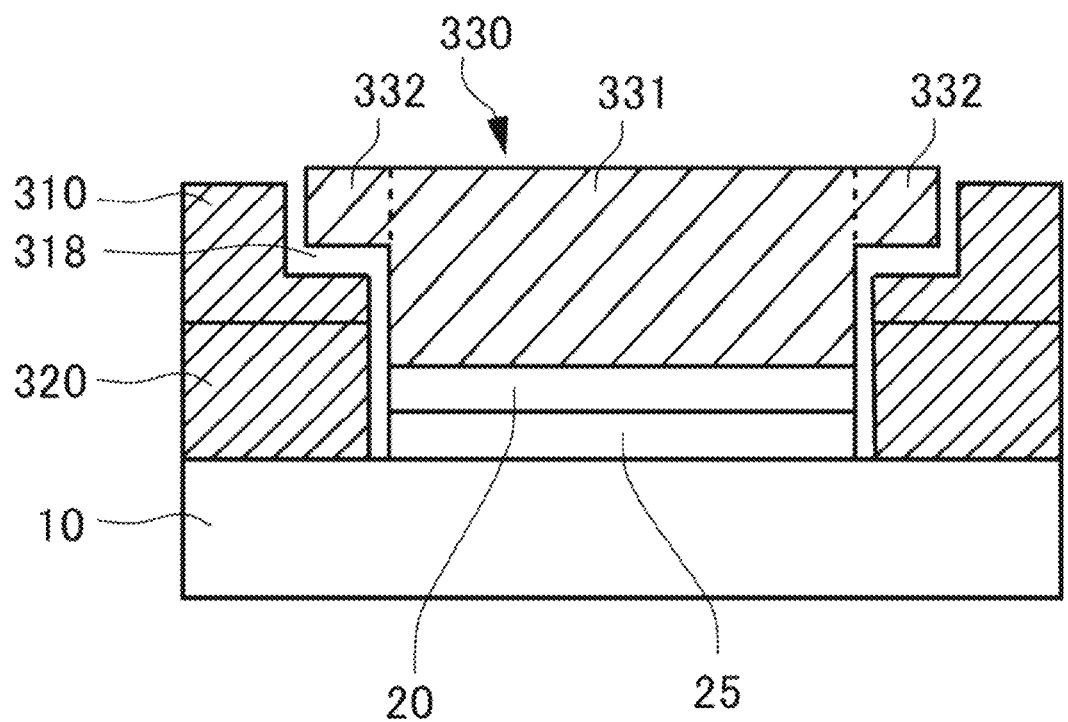
SECTION C
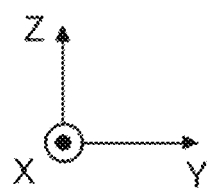
FIG. 3C

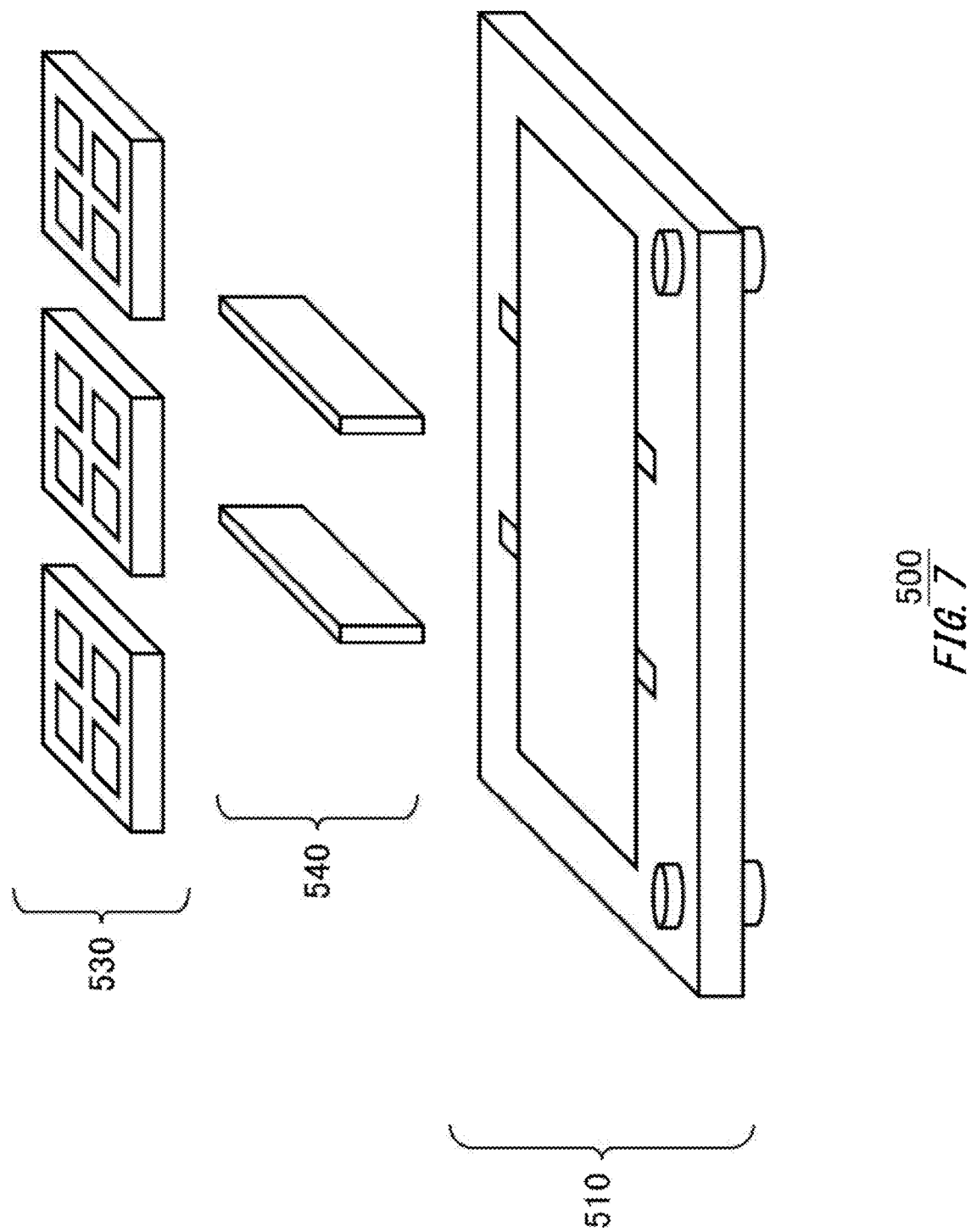

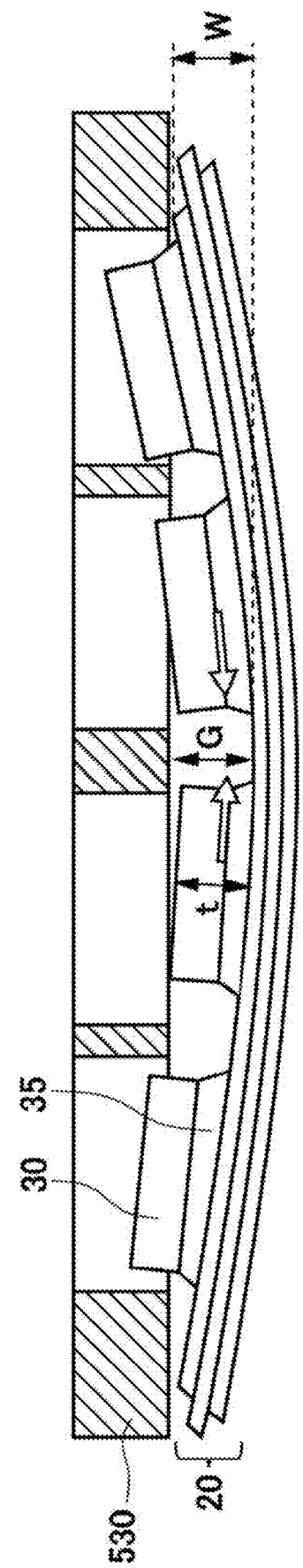

ASSEMBLY JIG SET AND MANUFACTURING METHOD OF SEMICONDUCTOR MODULE

The contents of the following Japanese patent application (s) are incorporated herein by reference:
NO. 2019-079021 filed in JP on Apr. 18, 2019.

BACKGROUND

1. Technical Field

The present invention relates to an assembly jig set and a manufacturing method of a semiconductor module.

2. Related Art

A conventional manufacturing method using a jig for assembling a semiconductor module has been known (refer to Patent Literatures 1 and 2, for example).
Patent Literature 1: Japanese Patent Application Publication No. 2012-164841
Patent Literature 2: Japanese Patent Application Publication No. 2009-267161

SUMMARY

However, the conventional manufacturing method has had difficulty in preventing a semiconductor chip from slipping in under a jig while responding to high-density mounting.

A first aspect of the present invention provides an assembly jig set of semiconductor module having a plurality of semiconductor chips, the assembly jig set comprising: a first outer frame jig; and a plurality of inner piece jigs positioned by the first outer frame jig and each having a sectioned shape corresponding to the first outer frame jig, wherein one of the inner piece jigs has a plurality of opening portions for positioning the semiconductor chips.

The inner piece jigs may each have: a main body portion provided with the opening portions; and an outer protruding portion extending from the main body portion and for being hooked and attached to the first outer frame jig.

The outer protruding portion may be provided at a position opposing to any one of the opening portions.

The opening portions of the inner piece jigs may each have an inner protruding portion for positioning the semiconductor chips.

The inner piece jigs may have a first inner piece jig and a second inner piece jig. The first inner piece jig may have an opening portion, three sides of the opening portion being defined by a main body portion of the first inner piece jig, and one side of the opening portion being defined by a main body portion of the second inner piece jig.

The inner piece jigs may each have a taper for preventing interference at an end portion where the inner piece jigs are adjacent to each other.

The assembly jig set may further include a second outer frame jig that positions an insulation substrate on which the semiconductor chips are mounted and that overlaps with the first outer frame jig. The second outer frame jig may have a positioning portion for aligning the second outer frame jig with the first outer frame jig.

The inner piece jigs may each have a recognition mark for positional recognition.

The assembly jig set may further include a partition plate for partitioning the inner piece jigs therebetween. The partition plate may have an attachment portion for being hooked and attached to the first outer frame jig.

A material of the partition plate may be different from a material of the first outer frame jig and a material of the inner piece jigs.

The material of the first outer frame jig and the inner piece jigs may be carbon. The material of the partition plate may be a carbon fiber composite material.

The inner piece jigs may include a pair of a first inner piece jig and a second inner piece jig. The pair of the first inner piece jig and the second inner piece jig may have an outer shape that can be inserted into an opening portion of the first outer frame jig.

The first inner piece jig and the second inner piece jig may each have: a main body portion provided with at least one opening portion for positioning a semiconductor chip; and an outer protruding portion extending from the main body portion and for being hooked to an edge of the opening portion of the first outer frame jig.

The outer protruding portion may be provided at a position opposing to any one of the at least one opening portion of the first inner piece jig and the at least one opening portion of the second inner piece jig.

In the first inner piece jig, the at least one opening portion provided to the main body portion may have four sides in a top plan view, and three sides of the four sides may be defined by the main body portion of the first inner piece jig, and one side thereof may be defined by the main body portion of the second inner piece jig.

The first inner piece jig and the second inner piece jig may each have a taper for preventing interference at an end portion where the first inner piece jig and the second inner piece jig are adjacent to each other.

The first inner piece jig and the second inner piece jig may each have a recognition mark for positional recognition.

The assembly jig set may further include: a pair of a third inner piece jig and a fourth inner piece jig; and a partition plate that partitions between the pair of the first inner piece jig and the second inner piece jig, and the pair of the third inner piece jig and the fourth inner piece jig. The partition plate may have an attachment portion for being hooked to the first outer frame jig.

Each of the first inner piece jig and the second inner piece jig may further have another outer protruding portion extending from the main body portion and for being hooked to the partition plate.

A second aspect of the present invention provides a manufacturing method of a semiconductor module having a plurality of semiconductor chips, the manufacturing method comprising: providing an insulation substrate on which the semiconductor chips are mounted; providing a first outer frame jig; attaching a plurality of inner piece jigs, each of which has a sectioned shape corresponding to the first outer frame jig, to the first outer frame jig; placing the inner piece jigs on the insulation substrate by one operation with the first outer frame jig; and positioning the semiconductor chips by the inner piece jigs to mount the semiconductor chips on the insulation substrate, wherein one of the inner piece jigs has a plurality of opening portions for positioning the semiconductor chips.

The manufacturing method of the semiconductor module may further include: placing a second outer frame jig on a base substrate of the semiconductor module; and positioning the insulation substrate by the second outer frame jig to place the insulation substrate on the base substrate.

The placing the inner piece jigs on the insulation substrate may include placing the first outer frame jig on the second outer frame jig.

The manufacturing method of the semiconductor module may further include attaching a partition plate for partitioning the inner piece jigs therebetween to the first outer frame jig.

It should be noted that the summary clause does not necessarily describe all necessary features of the embodiments of the present invention. The present invention may also be a sub-combination of the features described above.

BRIEF DESCRIPTION OF THE DRAWINGS

FIG. 2 illustrates an overview of a configuration of an assembly jig set 300.

FIG. 3A illustrates a cross-sectional view of a cross-section A of the assembly jig set 300 according to FIG. 2.

FIG. 3B illustrates a cross-sectional view of a cross-section B of the assembly jig set 300 according to FIG. 2.

FIG. 3C illustrates a cross-sectional view of a cross-section C of the assembly jig set 300 according to FIG. 2.

FIG. 7 illustrates an exemplary configuration of an assembly jig set 500 according to a comparative example.

FIG. 8A illustrates an exemplary cross-sectional view when the semiconductor chip 30 is mounted on the insulation substrate 20 using the assembly jig set 500.

DESCRIPTION OF EXEMPLARY EMBODIMENTS

The present invention will be described below through embodiments of the invention, but these embodiments do not limit the claimed invention. Moreover, all combinations of the features described in these embodiments are not necessarily essential to the solution of the invention.

Figure 1:
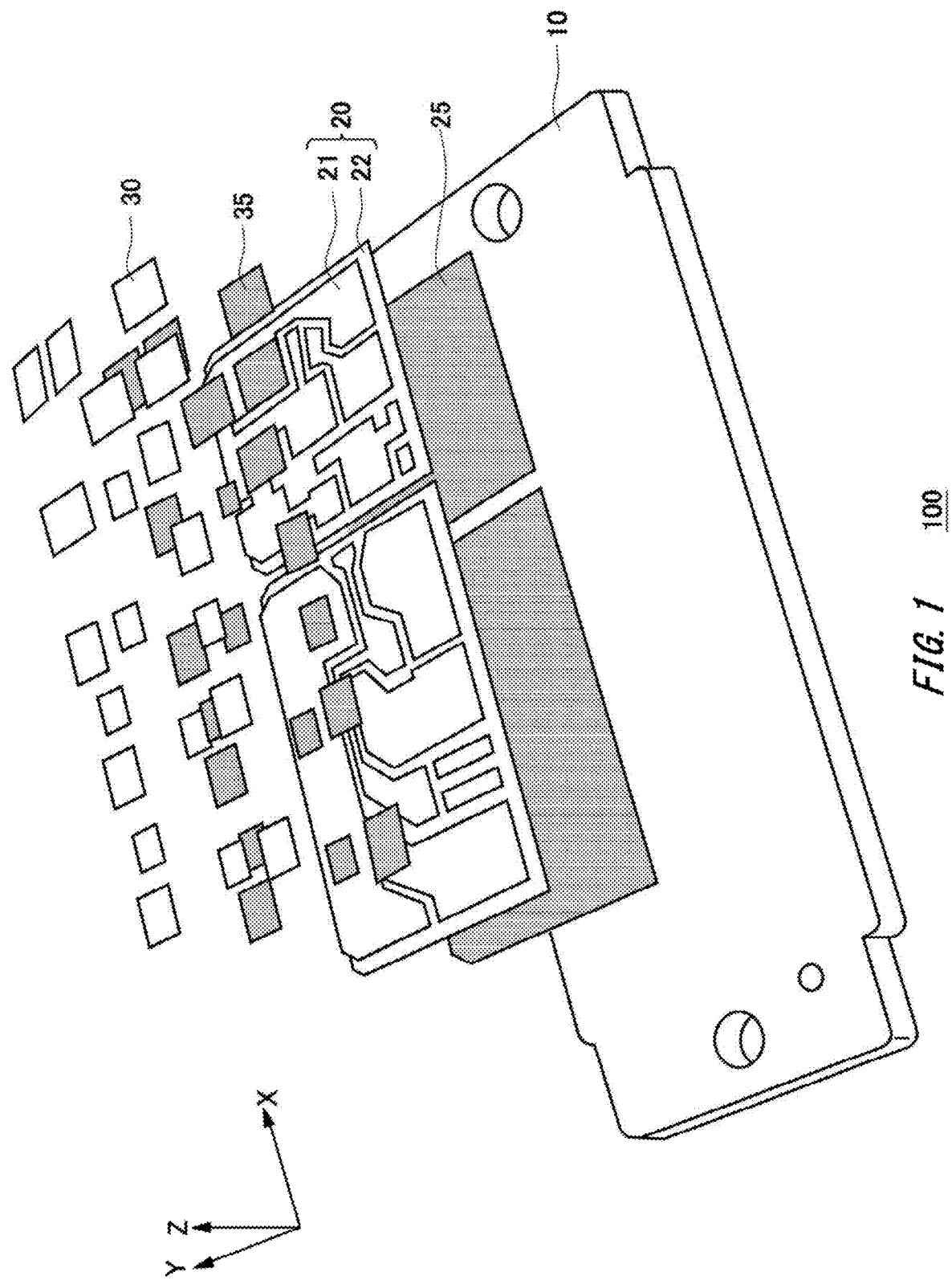
FIG. 1 illustrates an overview of a configuration of a semiconductor module 100.

FIG. 1 illustrates an overview of a configuration of a semiconductor module 100. The semiconductor module 100 includes a base substrate 10, an insulation substrate 20, and a semiconductor chip 30. The semiconductor 100 may be housed in a housing case to be sealed with a sealing resin. The long side direction of the base substrate 10 is referred to as an X-axis, and the short side direction thereof is referred to as a Y-axis. A Z-axis forms a right-handed system with the X-axis, and the Y-axis.

In the present specification, one side of the Z-axis direction is referred to as "upper", while the other side thereof is referred to as "lower". Out of two main surfaces of a substrate, a layer, or other members, one of the surfaces is referred to as an upper surface, and the other thereof is referred to as a lower surface. "Upper", "lower", "front", and "back" directions are not limited to a gravitational direction, or an attachment direction of the semiconductor chip 30 to a substrate or the like upon mounting the semiconductor chip 30. A top plan view is a view when an assembly jig set 300 is viewed from a Z-axis forward direction.

The base substrate 10 is provided on the lower surface side of the semiconductor module 100. The base substrate 10 may be a plate-like metal sheet having planar surfaces parallel to an X-Y plane. A material of the base substrate 10 is, for example, a metallic material including aluminum or copper. The base substrate 10 may function as a heat dissipation plate and be connected to a cooling unit such as a fin.

The insulation substrate 20 is a substrate on which the semiconductor chip 30 is mounted. The insulation substrate 20 is solder-jointed to the base substrate 10 by an under-substrate solder portion 25. The insulation substrate 20 is, for example, a DCB (Direct Copper Bonding) substrate or an AMB (Active Metal Brazing) substrate. The insulation substrate 20 includes a conductive plate 21 and an insulation plate 22. The insulation plate 22 is formed using a ceramic material, such as alumina ($Al_2O_3$), aluminum nitride (AlN), or silicon nitride ($Si_3N_4$). The conductive plate 21 has conductive wiring patterns provided to the insulation plate 22. A material of the conductive plate 21 is, for example, copper.

In one example, the semiconductor chip 30 is a semiconductor device such as a transistor. The semiconductor chip 30 may be a vertical semiconductor switching device. The semiconductor chip 30 may be a power semiconductor combining a plurality of transistors and a plurality of diodes. The semiconductor chip 30 may be an insulated-gate bipolar transistor (IGBT), a RC-IGBT combining the IGBT and a free wheel diode (FWD), a MOS transistor, or the like. The semiconductor chip 30 may be formed using a semiconductor substrate made of silicon carbide, gallium nitride or the like, in addition to silicon. The semiconductor chip 30 is solder-jointed to the insulation substrate 20 by an under-chip solder portion 35. Heat generated in the semiconductor chip 30 is transmitted to the base substrate 10.

FIG. 2 illustrates an overview of a configuration of the assembly jig set 300. The assembly jig set 300 is used for assembling the semiconductor module 100. The assembly jig set 300 includes a first outer frame jig 310, a second outer frame jig 320, and a plurality of inner piece jigs 330. The assembly jig set 300 according to this example includes a partition plate 340 and a partition plate 350.

The second outer frame jig 320 is a jig for positioning the insulation substrate 20. The second outer frame jig 320 may position the under-substrate solder portion 25. The second outer frame jig 320 may be provided on the base substrate 10 and position a component such as the insulation substrate 20 at freely selected positions on the base substrate 10. The second outer frame jig 320 has a positioning portion 322, a positioning portion 324, and an opening portion 326.

The positioning portion 322 is provided on the lower surface side of the second outer frame jig 320. The positioning portion 322 determines a relative position between the base substrate 10 and the second outer frame jig 320. In one example, the positioning portion 322 is a protrusion for being inserted into a recessed portion provided to the base substrate 10. It should be noted that the configuration of the positioning portion 322 is not limited thereto.

The positioning portion 324 determines a relative position between the first outer frame jig 310 and the second outer frame jig 320. In one example, the positioning portion 324 is a protrusion for being inserted into a recessed portion provided to the first outer frame jig 310. It should be noted that the configuration of the positioning portion 324 is not limited thereto.

The first outer frame jig 310 is placed on the second outer frame jig 320. That is, the first outer frame jig 310 is superposed with the second outer frame jig 320. The first outer frame jig 310 has a positioning portion 312, an opening portion 316, and a groove 318.

The positioning portion 312 is provided corresponding to the positioning portion 324. The positioning portion 312 according to this example is an opening into which the positioning portion 324 is inserted.

The opening portion 316 is provided for attaching the inner piece jig 330 and the partition plate 340 to the first outer frame jig 310. The opening portion 316 has a shape corresponding to a shape of the inner piece jig 330 and that of the partition plate 340. This structure positions the inner piece jig 330 and the partition plate 340. While one opening portion 316 is provided to one first outer frame jig 310 in this example, a plurality of opening portions 316 may be provided thereto.

The groove 318 is provided on the upper surface of the first outer frame jig 310. The groove 318 is provided at a position corresponding to an outer protruding portion 332 or an attachment portion 342. Exercising ingenuity in the position of the groove 318 can prevent each of the inner piece jig 330 and the partition plate 340 from being attached to an incorrect position.

The inner piece jigs 330 are provided inside the first outer frame jig 310. In this example, three inner piece jigs 330 are provided. The inner piece jig 330 has a main body portion 331, a plurality of outer protruding portions 332, and a plurality of opening portions 334. The inner piece jig 330 according to this example has three outer protruding portions 332.

The main body portion 331 has a sectioned shape corresponding to the first outer frame jig 310. The sectioned shape is a shape obtained by sectioning the shape of the opening portion 316 of the first outer frame jig 310. That is, a shape corresponding to the opening portion 316 is obtained by integrating the shapes of the inner piece jigs 330. The inner piece jig 330 is positioned by the first outer frame jig 310. The inner piece jigs 330, in a usage state, may each have an outer shape that allows itself to be inserted into the opening portion 316 of the first outer frame jig 310 and thus be held. The inner piece jigs 330 may each have an outer shape corresponding to a sectioned region of the opening portion 316.

The outer protruding portion 332 is a protrusion provided so as to extend from the main body portion 331. The outer protruding portion 332 is attached to the first outer frame jig 310. The outer protruding portion 332 in this example is hooked and attached to the first outer frame jig 310.

The opening portion 334 is provided for positioning a component such as the semiconductor chip 30. A shape of the opening portion 334 according to this example is rectangular but is not limited thereto. The inner piece jig 330 is provided with the opening portions 334.

The partition plate 340 partitions the inner piece jigs 330 therebetween. The partition plate 340 is provided between the respective inner piece jigs 330. The partition plate 340 is provided for hooking the inner piece jig 330. The partition plate 340 has a main body portion 341 and the attachment portion 342. The main body portion 341 is provided adjacent to the inner piece jig 330 and positions the inner piece jig 330. The main body portion 341 according to this example positions the position of the inner piece jig 330 in the X-axis direction.

The attachment portion 342 is used for attaching the partition plate 340 to the first outer frame jig 310. The attachment portion 342 is a protruding portion extending from the main body portion 341 toward the first outer frame jig 310. The attachment portion 342 may hook and attach the partition plate 340 to the first outer frame jig 310. The attachment portion 342 is positioned by a position of the groove 318 of the first outer frame jig 310.

The partition plate 350 partitions the inner piece jigs 330 therebetween. The partition plate 350 is provided on the lower side of the partition plate 340. The partition plate 350 may be provided between the respective inner piece jigs 330. The partition plate 350 has a main body portion 351 and an attachment portion 352. The main body portion 351 is provided adjacent to the inner piece jig 330 and positions the insulation substrate 20 and the under-substrate solder portion 25.

The attachment portion 352 is used for attaching the partition plate 350 to the second outer frame jig 320. The attachment portion 352 is a protruding portion extending from the main body portion 351 toward the second outer frame jig 320. The attachment portion 352 may hook and attach the partition plate 350 to the second outer frame jig 320. The attachment portion 352 is positioned by a position of a groove 328 of the second outer frame jig 320.

The groove 328 is provided on the upper surface of the second outer frame jig 320. The groove 328 is provided at a position corresponding to the attachment portion 352. Exercising ingenuity in the position of the groove 328 can prevent the partition plate 350 from being attached to an incorrect position.

Materials of each member of the assembly jig set 300 may be identical or different from each other. The material of the assembly jig set 300 is selected from the viewpoint of easiness to be processed, cost, heat conductivity, and the like.

A material of the first outer frame jig 310, the second outer frame jig 320, and the inner piece jig 330 is, for example, carbon. The material of the first outer frame jig 310 and the inner piece jig 330 may be another material such as ceramic or metal. The material of the first outer frame jig 310 and that of the inner piece jig 330 may be different from each other.

A material of the partition plate 340 is different from the material of the first outer frame jig 310 and the inner piece jig 330. The partition plate 340 may be made of a material having strength higher than that of the material of the first outer frame jig 310 and the inner piece jig 330. The material of the partition plate 340 is, for example, a carbon fiber composite material. The material of the partition plate 340 may be another material such as carbon, ceramic and metal.

As described above, the inner piece jig 330 and the partition plate 340 are attached to the first outer frame jig 310. Consequently, the placing operation of the first outer frame jig 310 enables the execution of attachment and removal of the inner piece jigs 330 and the partition plates 340 by one operation. This improves workability of an assembly process of the semiconductor module 100.

FIG. 3A illustrates a cross-sectional view of a section A of the assembly jig set 300 according to FIG. 2. The cross-section A is a section passing through the inner piece jig 330 and the insulation substrate 20. The cross-section A passes through the positioning portion 312 and the positioning portion 324. FIG. 3A illustrates a state in which the second outer frame jig 320 is placed on the base substrate 10. The first outer frame jig 310 is superposed on the second outer frame jig 320.

The positioning portion 312 is provided at least on the lower surface of the first outer frame jig 310. The positioning portion 312 according to this example is an opening that is provided so as to penetrating the first outer frame jig 310 from the lower surface to the upper surface thereof. The positioning portion 312 is provided corresponding to a shape and a position of the positioning portion 324.

The positioning portion 324 is provided on the upper surface of the second outer frame jig 320. The positioning portion 324 according to this example is a protruding portion that protrudes toward the upper surface of the second outer frame jig 320. The positioning portion 324 is inserted into the positioning portion 312. This determines a relative position between the first outer frame jig 310 and the second outer frame jig 320.

FIG. 3B illustrates a cross-sectional view of a cross-section B of the assembly jig set 300 according to FIG. 2. The cross-section B is a cross-section passing through the partition plate 340. The partition plate 340 is positioned at a freely selected position of the first outer frame jig 310 by the attachment portion 342. The attachment portion 342 may be hooked to the first outer frame jig 310 to be attached to the first outer frame jig 310.

The partition plate 350 is positioned at a freely selected position of the second outer frame jig 320 by the attachment portion 352. The partition plate 350 is provided for positioning the insulation substrate 20 and the under-substrate solder portion 25. The attachment portion 352 may be hooked and attached to the second outer frame jig 320.

It should be noted that in the state where the first outer frame jig 310 is placed on the second outer frame jig 320, the partition plate 340 may be provided on the base substrate 10. In the state of the first outer frame jig 310 being superposed, the attachment portion 342 is not necessarily in contact with the first outer frame jig 310.

FIG. 3C is a cross-sectional view illustrating a cross-section C of the assembly jig set 300 according to FIG. 2. The cross-section C is a cross-sectional view passing through the outer protruding portion 332 of the inner piece jig 330. The inner piece jig 330 is positioned at the position of the groove 318 of the first outer frame jig 310 by the outer protruding portion 332. The inner piece jig 330 is placed on the insulation substrate 20. In the state of the first outer frame jig 310 being overlapped, the outer protruding portion 332 is not necessarily in contact with the first outer frame jig 310.

Figure 4:
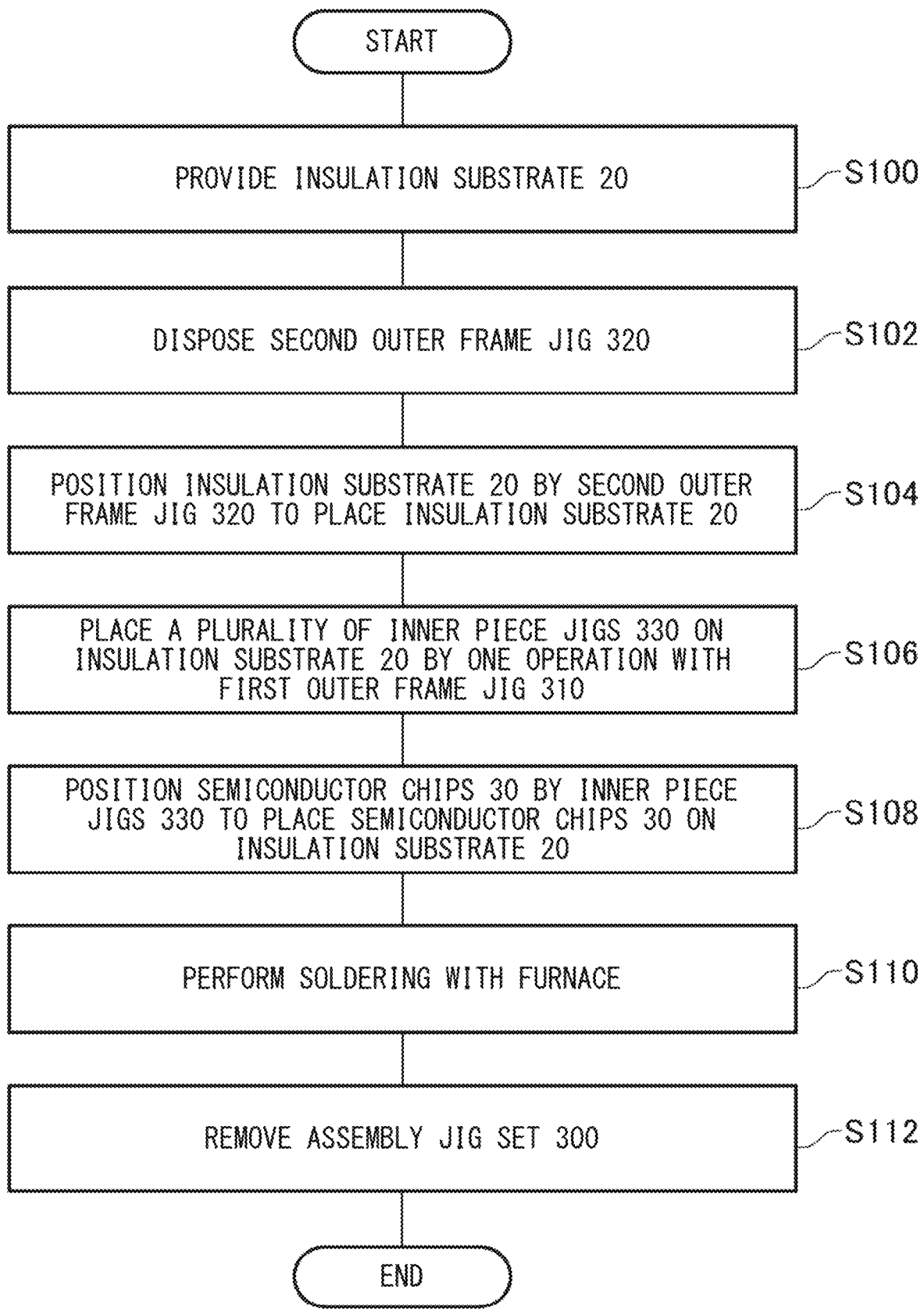
FIG. 4 illustrates an exemplary flowchart for a manufacturing method of the semiconductor module 100.

FIG. 4 illustrates an exemplary flowchart for a manufacturing method of the semiconductor module 100. In this example, the semiconductor module 100 is manufactured by performing Step S100 to Step S112.

At Step S100, the insulation substrate 20 is provided on which the semiconductor chips 30 are mounted. For example, the insulation substrate 20 is placed on the base substrate 10. The insulation substrate 20 may be disposed on an assembly jig tray, instead of being placed on the base substrate 10. At Step S102, the second outer frame jig 320 is disposed. For example, the second outer frame jig 320 is disposed on the base substrate 10. At Step S104, the insulation substrate 20 is positioned by the second outer frame jig 320 and placed on the base substrate 10.

At Step S106, the inner piece jigs 330 are placed on the insulation substrate 20 by one operation with the first outer frame jig 310. Since the inner piece jigs 330 are attached to the first outer frame jig 310, placing the first outer frame jig 310 on the second outer frame jig 320 places the inner piece jigs 330 on the insulation substrate 20 by one operation. Before performing Step S106, the inner piece jigs 330 are attached to the first outer frame jig 310. Before performing Step S106, the partition plate 340 may also be attached to the first outer frame jig 310.

At Step S108, the semiconductor chips 30 are positioned by the inner piece jigs 330 and placed on the insulation substrate 20. At Step S110, soldering is performed by melting solder by a furnace. For example, the insulation substrate 20 is solder-jointed to the base substrate 10 by the under-substrate solder portion 25. The semiconductor chip 30 is solder-jointed to the insulation substrate 20 by the under-chip solder portion 35.

At Step S112, the assembly jig set 300 is removed from the base substrate 10. Step S112 has two removal processes, i.e. removing the first outer frame jig 310 and removing the second outer frame jig 320. Removing the first outer frame jig 310 removes the inner piece jig 330 and the partition plate 340 from the base substrate 10. It should be noted that a resin case and a sealing resin may be attached at a freely selected manufacturing process. Consequently, the semiconductor module 100 is manufactured.

Figure 5A:
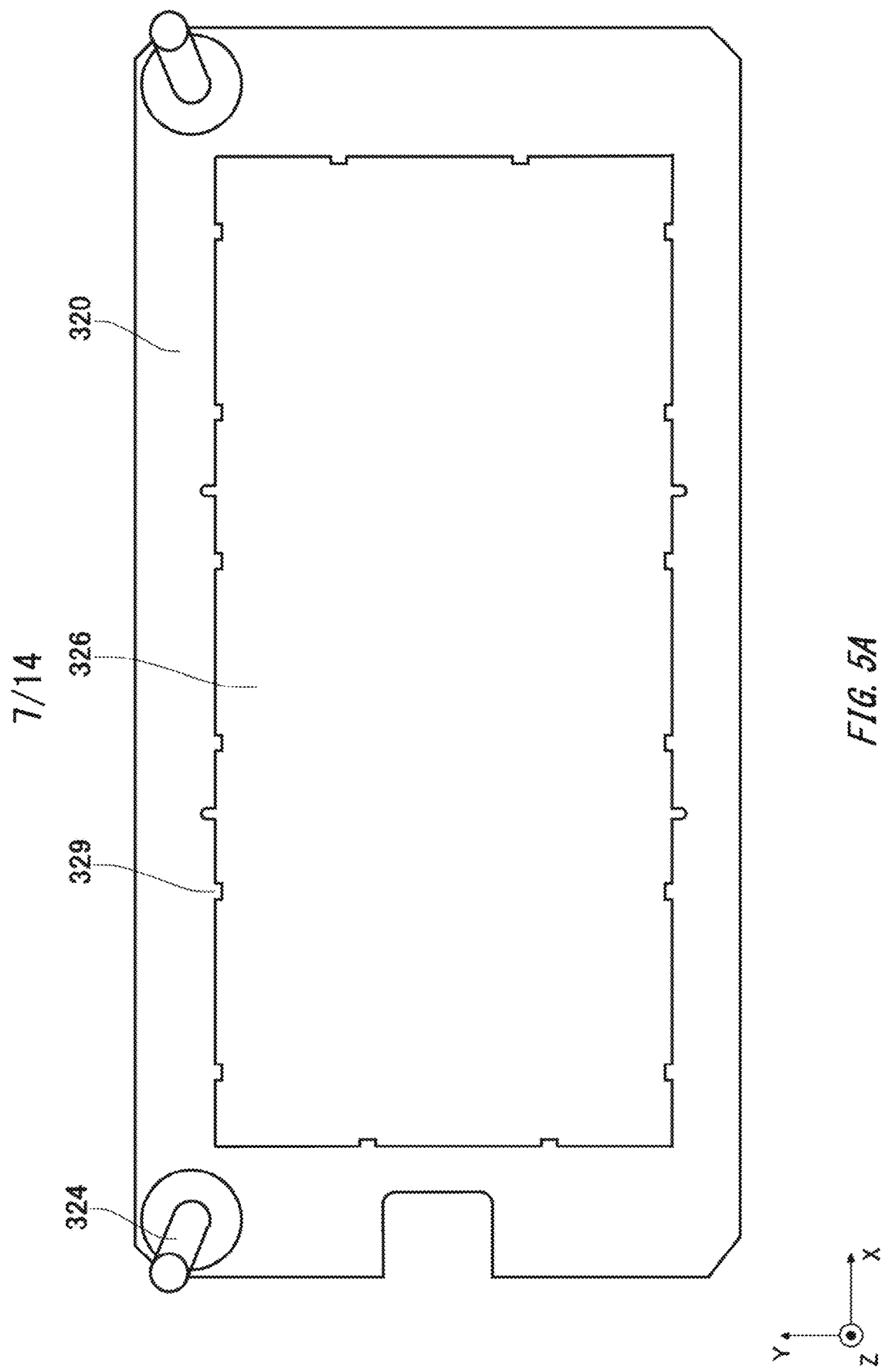
FIG. 5A illustrates an exemplary configuration of a second outer frame jig 320.

FIG. 5A illustrates an exemplary configuration of the second outer frame jig 320. The second outer frame jig 320 has the positioning portion 324, and the opening portion 326.

The positioning portion 324 is a member for positioning with respect to the first outer frame jig 310. The positioning portion 324 has a pin shape and is inserted into the positioning portion 312 of the first outer frame jig 310 to determine a relative position between the first outer frame jig 310 and the second outer frame jig 320. The shape of the positioning portion 324 only needs to determine the relative position between the first outer frame jig 310 and the second outer frame jig 320, and is not limited to this example.

The opening portion 326 is used for positioning the insulation substrate 20. The insulation substrate 20 is placed on the base substrate through the opening portion 326. The opening portion 326 may be used for placing the under-substrate solder portion 25 or other members.

An inner protruding portion 329 is provided at an end portion of the opening portion 326. The inner protruding portion 329 guides the insulation substrate 20 or the like to a freely selected position. Providing a plurality of inner protruding portions 329 can define a region between adjacent inner protruding portions 329 where solder melted upon reflow soldering spreads. The region between the adjacent inner protruding portions 329 can prevent scattering of solder. A section of each of the inner protruding portions 329 may be provided with an inclination for guiding a position of the semiconductor chip 30.

Figure 5B:
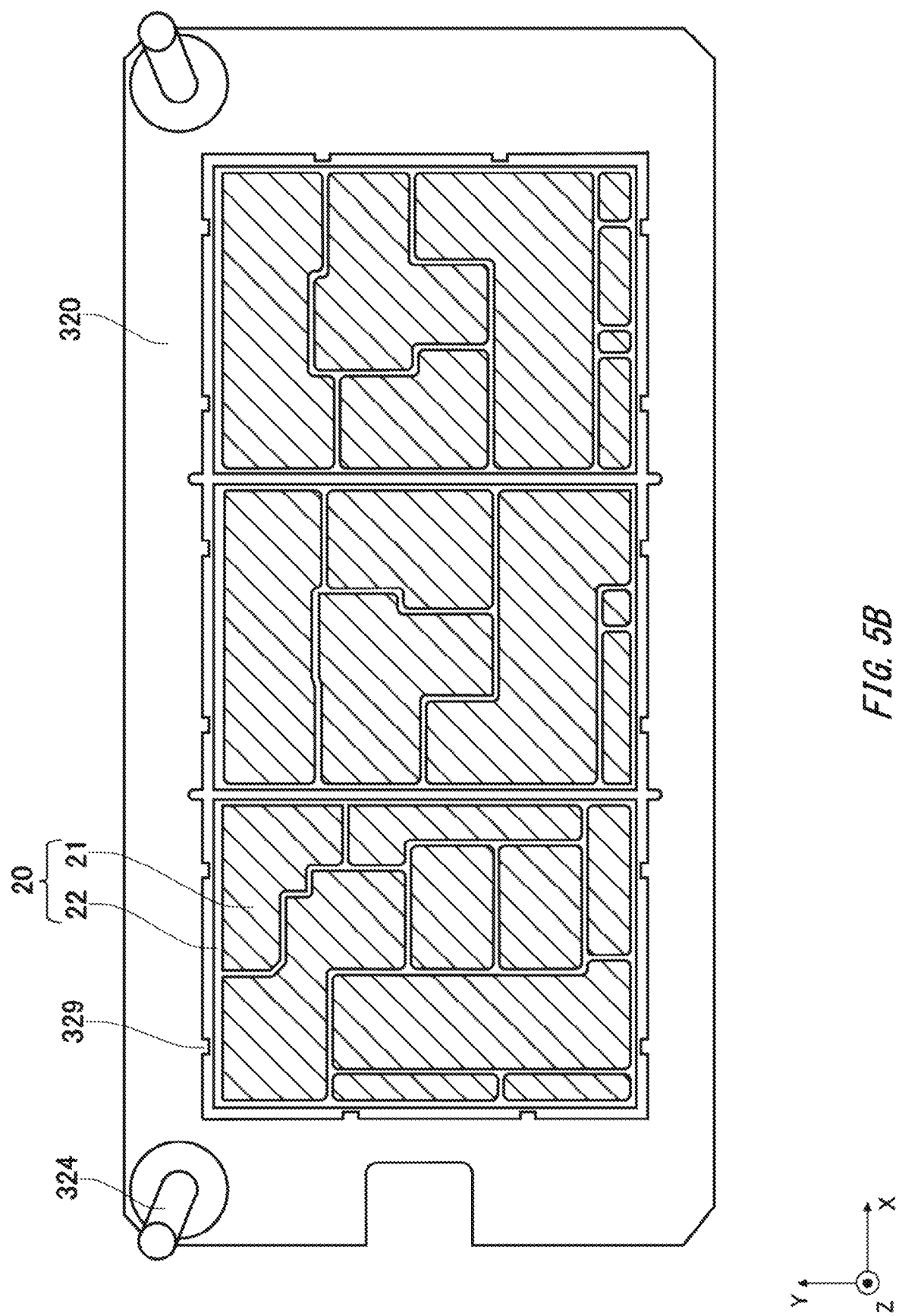
FIG. 5B illustrates an exemplary state in which an insulation substrate 20 is placed on a base substrate 10.

FIG. 5B illustrates an exemplary state in which the insulation substrate 20 is placed on the base substrate 10. The insulation substrate 20 is positioned by the second outer frame jig 320 and placed. In this example, three insulation substrates 20 are arranged in the longitudinal direction of the first outer frame jig 310. The three insulation substrates 20 have the respective conductive plates 21 having different patterns but may have the respective conductive plates 21 having the same pattern.

Figure 5C:
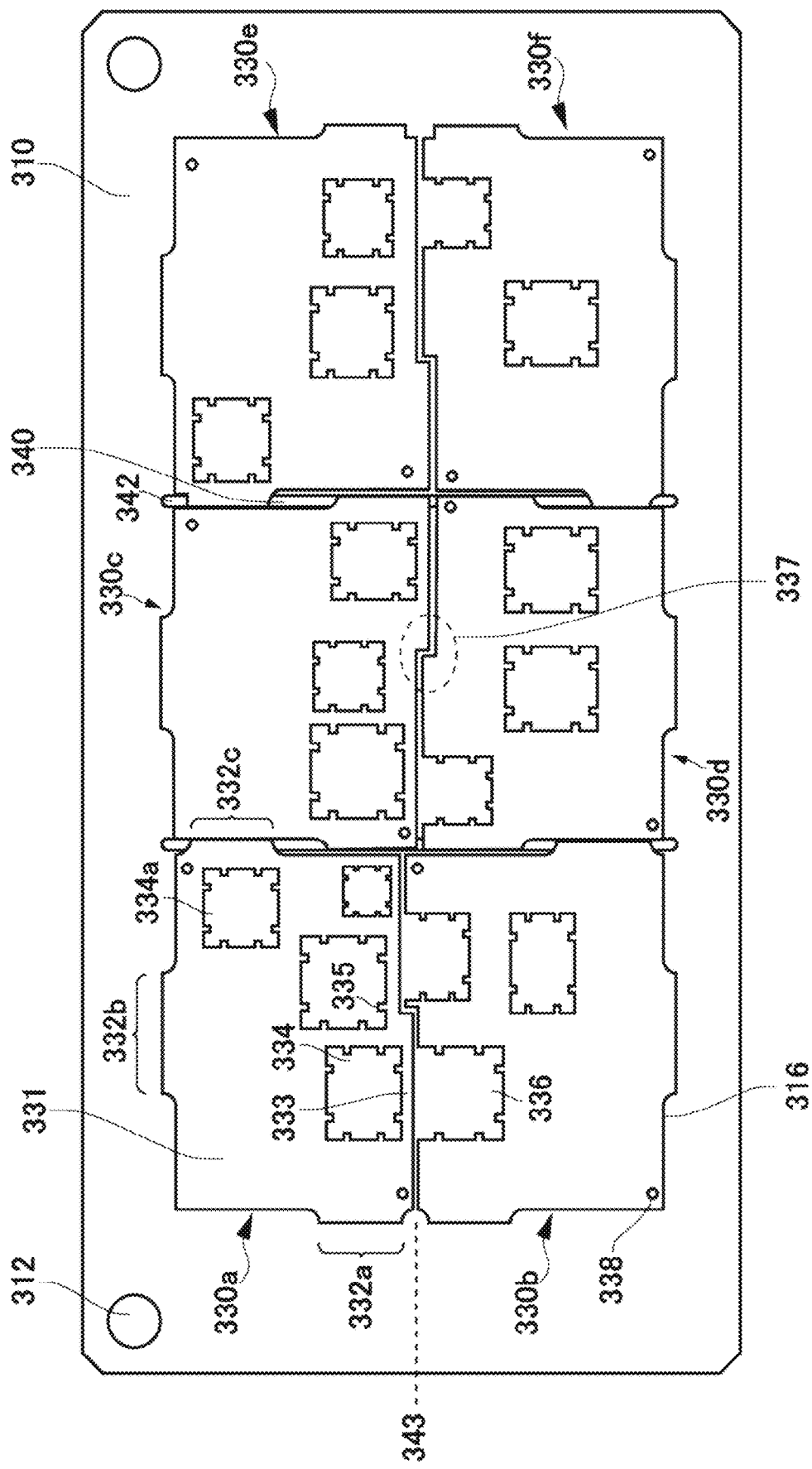
FIG. 5C is a plan view illustrating an exemplary state in which a first outer frame jig 310 and the second outer frame jig 320 overlap with each other.

FIG. 5C is a plan view illustrating an exemplary state in which the first outer frame jig 310 and the second outer frame jig 320 overlap with each other. The inner piece jig 330 and the partition plate 340 are attached to the first outer frame jig 310. Six inner piece jigs 330 and two partition plates 340 are attached to the first outer frame jig 310 according to this example.

The inner piece jigs 330 include inner piece jigs 330a to 330f. The inner piece jigs 330 may include three sets of a pair of inner piece jigs 330a and 330b, a pair of inner piece jigs 330c and 330d, and a pair of inner piece jigs 330e and 330f. In the present specification, the pair of inner piece jigs 330 indicates formation of a predetermined outer shape by the inner piece jigs 330 being in contact with each other. The pair of inner piece jigs 330 has an outer shape that can be inserted into the opening portion 316 of the first outer frame jig 310. The pair of inner piece jigs 330a and 330b may be partitioned from the pair of inner piece jigs 330c and 330d by the partition plate 340. Similarly, the pair of inner piece jigs 330c and 330d may be partitioned from the pair of inner piece jigs 330e and 330f by the partition plate 340.

One of the inner piece jigs 330 has the opening portions 334 corresponding to the semiconductor chips 30. For example, the inner piece jig 330a has four opening portions 334. The inner piece jig 330b has three opening portions 334. The number of the opening portions 334 is not specifically limited.

The opening portion 334 is provided for defining a mounting position of a component such as the semiconductor chip 30 on the insulation substrate 20. The opening portion 334 has a shape corresponding to a component such as the semiconductor chip 30. The opening portion 334 is provided corresponding to the size and the position of a component such as the semiconductor chip 30. As one example, the pair of inner piece jigs 330a and 330b may be used for one sheet of the insulation substrate 20. As one example, the insulation substrate 20 has a rectangular shape having long sides and short sides in a top plan view. The pair of inner piece jigs 330a and 330b may form a line 343 sectioning the long sides of the insulation substrate 20 in a usage state.

The outer protruding portion 332 is a member for attaching the inner piece jig 330 to the first outer frame jig 310. The outer protruding portion 332 according to this example is a protruding portion for hooking the inner piece jig 330 to the first outer frame jig 310. In this example, three outer protruding portions 332 are provided to each inner piece jig 330. For example, an outer protruding portion 332a is provided on the short side of the first outer frame jig 310. An outer protruding portion 332b is provided on the long side of the first outer frame jig 310. An outer protruding portion 332c is provided on the partition plate 340.

The outer protruding portion 332c is provided at a position opposing to an opening portion 334a. When the outer protruding portion 334a is positioned at an end portion of the inner piece jig 330, a width of the main body portion 331 may be narrowed. Even in this case, increasing the width of the main body portion 331 by the outer protruding portion 332c can increase the strength of the main body portion 331. The outer protruding portion 332c is provided apart from the outer protruding portion 332 of the inner piece jig 330c so as not to interfere therewith. The outer protruding portion 332c may be provided for being hooked to the partition plate 340.

An inner protruding portion 335 is provided at an end portion of the opening portion 334. The inner protruding portion 335 guides the semiconductor chip 30 or the like to a freely selected position. Providing a plurality of inner protruding portions 335 can define a region between adjacent inner protruding portions 335 where solder melted upon reflow soldering spreads. The regions between the adjacent inner protruding portions 335 can prevent scattering of solder. A section of each of the inner protruding portions 335 may be provided with an inclination for guiding the position of the semiconductor chip 30.

An opening portion 336 is an opening provided in the inner piece jig 330b. The opening portion 336 is an opening, part of which is defined by the inner piece jig 330a. The opening portion 336 according to this example has a rectangular shape. The opening portion 336 may have at least four sides in a top plan view. Three sides of the opening portion 336 are defined by the main body portion 331 of the inner piece jig 330b and the remaining one side thereof is defined by the main body portion 331 of the inner piece jig 330a. It should be noted that the inner piece jig 330a is one example of a first inner piece jig and the inner piece jig 330b is one example of a second inner piece jig. The inner protruding portion 335 may be provided inside the opening portion 336.

A shared portion 333 is a side opposing to the opening portion 336. The shared portion 333 serves both as one side of the opening portion 334 and one side of the opening portion 336. That is, providing the shared portion 333 when two openings are adjacent to each other can increase the width of the main body portion 331. This can increase the strength of the inner piece jig 330 even when the semiconductor chips 30 are mounted with a high density.

A step portion 337 is an L-shaped region provided at end portions of adjacent inner piece jigs 330. Providing the step portion 337 allows the adjacent inner piece jigs 330 to follow warping of the insulation substrate 20 while performing the positioning. The step portion 337 is provided, for example, between the inner piece jigs 330a and 330b, between the inner piece jigs 330c and 330d, and between the inner piece jigs 330e and 330f. The position and the shape of the step portion 337 may be changed as appropriate taking into account of the position of the opening portion 334, the strength of the inner piece jig 330, or the like.

A recognition mark 338 is a mark for positional recognition of the inner piece jig 330. Providing the recognition mark 338 causes a device such as a mounter to recognize the position of the inner piece jig 330. This can achieve automatic placing of the inner piece jig 330. Further, identifying the position of the opening portion 334 from the position of the inner piece jig 330 enables the automatic placing of the semiconductor chip 30. Two circular marks serving as the recognition marks 338 are set for each inner piece jig 330. The number and the shape of the recognition mark 338 are not limited thereto.

Figure 6A:
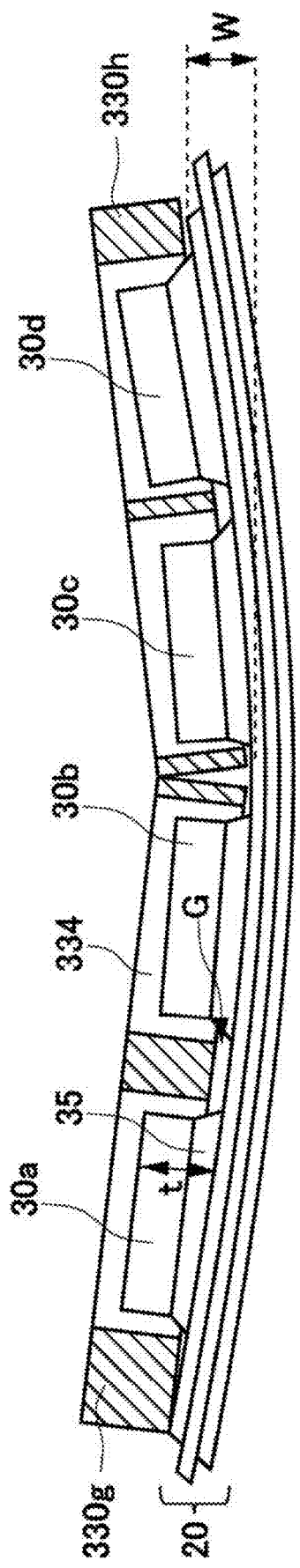
FIG. 6A illustrates an exemplary cross-sectional view when a semiconductor chip 30 is mounted on the insulation substrate 20 using an inner piece jig 330 according to a working example.

FIG. 6A illustrates an exemplary cross-sectional view when the semiconductor chip 30 is mounted on the insulation substrate 20 using the inner piece jig 330 according to a working example. This example represents a cross-section passing through two inner piece jigs 330 and passing through four semiconductor chips 30.

A film thickness t is a total of a film thickness of the semiconductor chip 30 and that of the under-chip solder portion 35. When the under-chip solder portion 35 is melted, the semiconductor chip 30 may move. When the film thickness t is small, the semiconductor chip 30 is likely to slip in under the inner piece jig 330.

A warping width W represents an amount of warping of the insulation substrate 20. The warping of the insulation substrate 20 is caused by thermal stress upon solder joint. The warping width W of the insulation substrate 20 changes depending on conditions such as a shape and a material of the insulation substrate 20.

A gap G represents spacing between the inner piece jig 330 and the insulation substrate 20. The gap G changes depending on the warping width W and the following characteristics of the inner piece jig 330 to the insulation substrate 20. When the gap G is larger than the film thickness t, the semiconductor chip 30 might slip in under the inner piece jig 330. Making the gap G smaller than the film thickness t can prevent the semiconductor chip 30 from slipping in under the inner piece jig 330.

The inner piece jig 330 is provided in a sectioned manner with respect to the insulation substrate 20. The inner piece jig 330 according to this example is provided by being sectioned into two, i.e., an inner piece jig 330g and an inner piece jig 330h. Sectioning the inner piece jig 330 improves the following characteristics to the warping of the insulation substrate 20. This can respond to high-density mounting of the semiconductor chips 30 and reduce cost as well.

The number of sections of the inner piece jig 330 is not specifically limited. This example illustrates the case where the number of sections is two, but the number of sections may be three or more. Increasing the number of sections of the inner piece jig 330 improves the following characteristics to the warping of the insulation substrate 20 and thus reduces the gap G, thereby making it easier to further prevent the slip-in of the semiconductor chip 30. Meanwhile, increasing the number of sections of the inner piece jig 330 may pose problems of cost and the strength of the inner piece jig 330. The number of sections of the inner piece jig 330 may be changed appropriately, depending on, for example, the area of the insulation substrate 20 and the thickness of the semiconductor chip 30.

The inner piece jig 330 is provided corresponding to the semiconductor chips 30. That is, the inner piece jig 330 is not provided for each single semiconductor chip 30. For example, the inner piece jig 330g is provided corresponding to a semiconductor chip 30a and a semiconductor chip 30b. The inner piece jig 330h is provided corresponding to a semiconductor chip 30c and a semiconductor chip 30d. Providing the inner piece jig 330 corresponding to the semiconductor chips 330 can increase the strength of the inner piece jig 330.

Figure 6B:
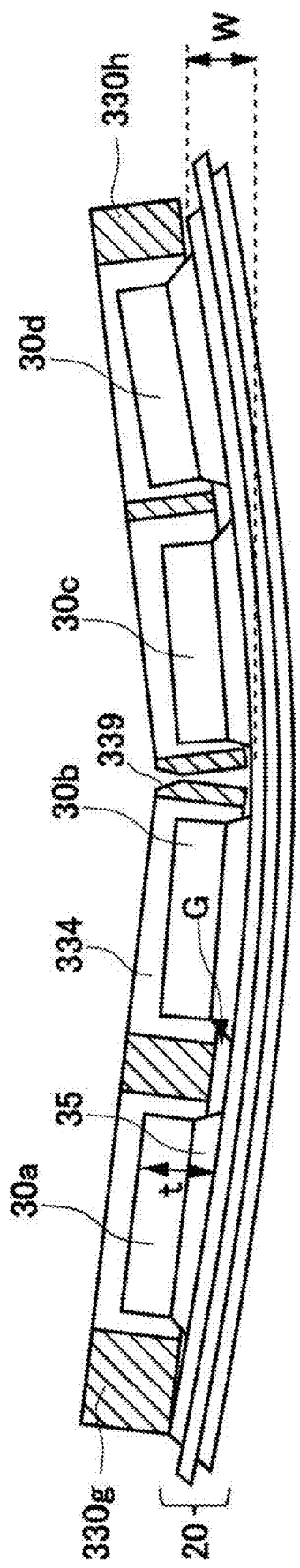
FIG. 6B illustrates an exemplary cross-sectional view when the semiconductor chip 30 is mounted on the insulation substrate 20 using the inner piece jig 330 according to a working example.

FIG. 6B is an exemplary cross-sectional view when the semiconductor chip 30 is mounted on the insulation substrate 20 using the inner piece jig 330 according to a working example. The inner piece jig 330 according to this example has a taper 339. The inner piece jigs 330g and 330h serve as an example of the inner piece jigs 330 provided adjacent to each other.

The taper 339 is an inclined part of the upper surface of the inner piece jig 330. The taper 339 is provided at an end portion where the inner piece jigs 330g and 330h are adjacent to each other. The taper 339 prevents interference between the inner piece jigs 330. The taper 339 according to this example is provided to each of the inner piece jigs 330g and 330h. The taper 339 may be provided to only one of the inner piece jigs 330g and 330h. Providing the taper 339 can prevent interference between the inner piece jigs 330 when the insulation substrate 20 is warped. This makes the inner piece jigs 330 easier to follow the warping of the insulation substrate 20, which can reduce the gap G. This improves the accuracy of positioning the semiconductor chips 30, thereby making it further easier to respond to the high-density mounting.

As described above, the assembly jig set 300 can respond to a case where spacing between the semiconductor chips 30 is narrow due to the high-density mounting and a case where the semiconductor chips 30 are provided at an end portion of the base substrate 10. The assembly jig set 300 can increase the accuracy of positioning the semiconductor chips 30 while improving the workability.

FIG. 7 illustrates an exemplary configuration of an assembly jig set 500 according to a comparative example. The assembly jig set 500 includes an outer frame jig 510, an inner piece jig 530, and a partition plate 540. In the assembly jig set 500, the inner piece jig 530 and the partition plate 540 are not attached to an outer frame jig 510, so that the placing operation of jigs needs to be repeated the number of times depending on the number of the inner piece jigs 530 and the number of the partition plates 540.

For example, the attachment process of the assembly jig set 500 requires six times of attachment operations for the outer frame jig 510, three inner piece jigs 530, and two partition plates 540. Similarly, the removal process of the assembly jig set 500 requires six times of removal operations for the outer frame jig 510, the three inner piece jigs 530, and the two partition plates 540. Thus, using the assembly jig set 500 requires a total of twelve times of placing operations of the jigs.

On the other hand, the attachment operation of the assembly jig set 300 according to the working example only requires two times of attachment operations for the first outer frame jig 310 and the second outer frame jig 320. Similarly, the removal operation of the assembly jig set 300 only requires two times of removal operations for the first outer frame jig 310 and the second outer frame jig 320. Thus, using the assembly jig set 300 only requires a total of four times of placing operations of the jigs. Once the inner piece jigs 330 and the partition plates 340 are attached to the first outer frame jig 310, the inner piece jigs 330 and the partition plates 340 do not have to be attached or removed after that.

FIG. 8A illustrates an exemplary cross-sectional view when the semiconductor chip 30 is mounted on the insulation substrate 20 using the assembly jig set 500 according to the comparative example. The inner piece jig 530 according to this example is an integral piece type without being sectioned and cannot follow the warping of the insulation substrate 20. Thus, the gap G is larger than that of the working example. Accordingly, in the comparative example, the gap G may be larger than the thickness t. In this case, the semiconductor chip 30 slips in under the inner piece jig 530 when the under-chip solder portion 35 is melted, thereby making it harder to place the semiconductor chip 30 at an accurate position.

Figure 8B:
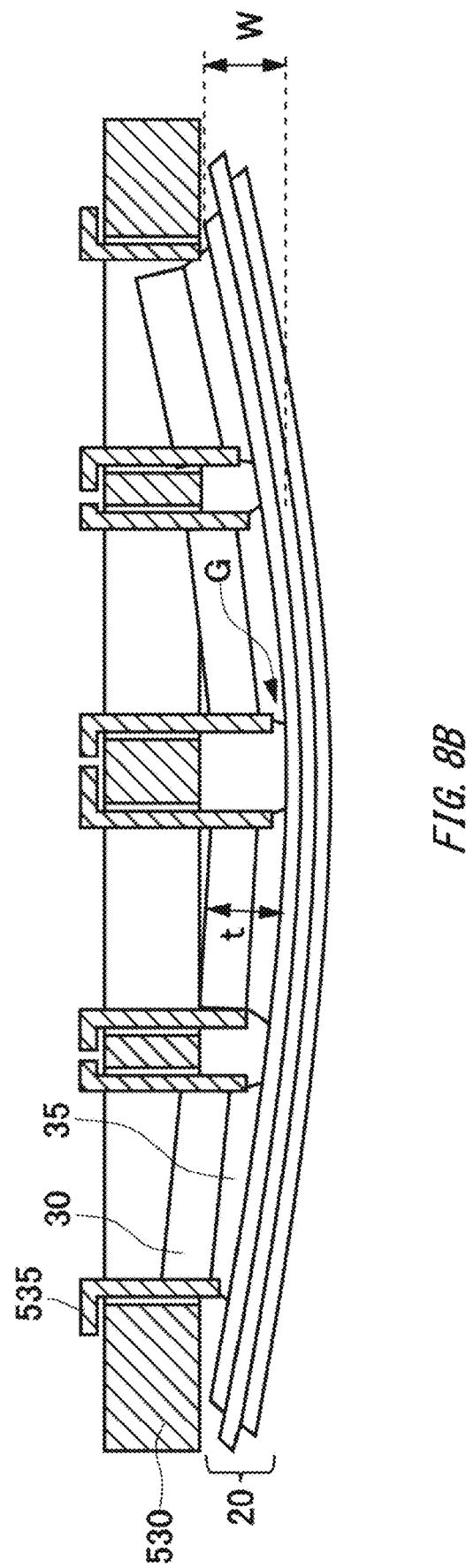
FIG. 8B illustrates an exemplary cross-sectional view when the semiconductor chip 30 is mounted on the insulation substrate 20 using the assembly jig set 500 according to a comparative example.

FIG. 8B illustrates an exemplary cross-sectional view when the semiconductor chip 30 is mounted on the insulation substrate 20 using the assembly jig set 500 according to a comparative example. The assembly jig set 500 according to this example is an independent piece type that has independent pieces 535 in respective openings of the inner piece jig 530.

The independent pieces 535 are provided corresponding to the respective semiconductor chips 30. A length of the independent piece 535 in the thickness direction of the semiconductor chip 30 can be individually adjusted depending on the position and the shape of the semiconductor chip 30. The length of the independent piece 535 is adjusted to prevent the slip-in of the semiconductor chip 30. Providing the independent piece 535 makes it easier to respond to the slip-in of the semiconductor chip 30, but it cannot respond to the high-density mounting with narrow spacing between the semiconductor chips 30. Particularly, providing the semiconductor chip at the end portion of the base substrate 10 poses a problem of the strength of the inner piece jig 530 and the independent piece 535. The independent piece 535 depending on the shape of each semiconductor chip 30 needs to be prepared, thereby increasing the number of components and leading to increased cost.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An assembly jig set of semiconductor module having a plurality of semiconductor chips, the assembly jig set comprising:
   a first outer frame jig; and
   a plurality of inner piece jigs positioned by the first outer frame jig and each having a sectioned shape corresponding to the first outer frame jig,
   wherein at least one of the inner piece jigs has a plurality of opening portions for positioning the semiconductor chips, and
   wherein the inner piece jigs each have a taper for preventing interference at an end portion where the inner piece jigs are adjacent to each other.

2. The assembly jig set according to claim 1,
   wherein the inner piece jigs each have:
   a main body portion provided with the opening portions; and
   an outer protruding portion extending from the main body portion and for being hooked and attached to the first outer frame jig.

3. The assembly jig set according to claim 2,
   wherein the outer protruding portion is provided at a position opposing to any one of the opening portions.

4. The assembly jig set according to claim 1,
   wherein the opening portions of the inner piece jigs each have an inner protruding portion for positioning the semiconductor chips.

5. The assembly jig set according to claim 1, wherein
   the inner piece jigs have a first inner piece jig and a second inner piece jig, and
   the first inner piece jig has an opening portion, three sides of the opening portion being defined by a main body portion of the first inner piece jig, and one side of the opening portion being defined by a main body portion of the second inner piece jig.

6. An assembly jig set of semiconductor module having a plurality of semiconductor chips, the assembly jig set comprising:
   a first outer frame jig;
   a plurality of inner piece jigs positioned by the first outer frame jig and each having a sectioned shape corresponding to the first outer frame jig, wherein at least one of the inner piece jigs has a plurality of opening portions for positioning the semiconductor chips; and
   a second outer frame jig that positions an insulation substrate on which the semiconductor chips are mounted and that overlaps with the first outer frame jig, wherein the second outer frame jig has a positioning portion for aligning the second outer frame jig with the first outer frame jig.

7. The assembly jig set according to claim 1,
   wherein the inner piece jigs each have a recognition mark for positional recognition.

8. An assembly jig set of semiconductor module having a plurality of semiconductor chips, the assembly jig set comprising:
   a first outer frame jig;
   a plurality of inner piece jigs positioned by the first outer frame jig and each having a sectioned shape corresponding to the first outer frame jig, wherein at least one of the inner piece jigs has a plurality of opening portions for positioning the semiconductor chips; and
   a partition plate for partitioning the inner piece jigs therebetween, wherein the partition plate has an attachment portion for being hooked and attached to the first outer frame jig.

9. The assembly jig set according to claim 8,
   wherein a material of the partition plate is different from a material of the first outer frame jig and a material of the inner piece jigs.

10. The assembly jig set according to claim 9, wherein
    the material of the first outer frame jig and the inner piece jigs is carbon, and
    the material of the partition plate is a carbon fiber composite material.

11. The assembly jig set according to claim 1, wherein
    the inner piece jigs include a pair of a first inner piece jig and a second inner piece jig, and
    the pair of the first inner piece jig and the second inner piece jig has an outer shape that can be inserted into an opening portion of the first outer frame jig.

12. The assembly jig set according to claim 11, wherein
    the first inner piece jig and the second inner piece jig each have:
    a main body portion provided with at least one opening portion for positioning a semiconductor chip; and
    an outer protruding portion extending from the main body portion and for being hooked to an edge of the opening portion of the first outer frame jig.

13. The assembly jig set according to claim 12,
    wherein the outer protruding portion is provided at a position opposing to any one of the at least one opening portion of the first inner piece jig and the at least one opening portion of the second inner piece jig.

14. The assembly jig set according to claim 12,
    wherein in the first inner piece jig, the at least one opening portion provided to the main body portion has four sides in a top plan view, and three sides of the four sides are defined by the main body portion of the first inner piece jig, and one side thereof is defined by the main body portion of the second inner piece jig.

15. The assembly jig set according to claim 11, wherein the first inner piece jig and the second inner piece jig each have a taper for preventing interference at an end portion where the first inner piece jig and the second inner piece jig are adjacent to each other.

16. The assembly jig set according to claim 11, wherein the first inner piece jig and the second inner piece jig each have a recognition mark for positional recognition.

17. The assembly jig set according to claim 12, further comprising:
   a pair of a third inner piece jig and a fourth inner piece jig; and
   a partition plate that partitions between the pair of the first inner piece jig and the second inner piece jig, and the pair of the third inner piece jig and the fourth inner piece jig,
   wherein the partition plate has an attachment portion for being hooked to the first outer frame jig.

18. The assembly jig set according to claim 17, wherein each of the first inner piece jig and the second inner piece jig further has another outer protruding portion extending from the main body portion and for being hooked to the partition plate.

* * * * *